(12) United States Patent
Kim et al.

(10) Patent No.: US 8,953,367 B2
(45) Date of Patent: *Feb. 10, 2015

(54) THREE-DIMENSIONAL MEMORY ARRAY AND OPERATION SCHEME

(71) Applicant: International Business Machines Corporation, Armonk, NY (US)

(72) Inventors: SangBum Kim, Stamford, CT (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/958,648

(22) Filed: Aug. 5, 2013

(65) Prior Publication Data

US 2014/0160838 A1 Jun. 12, 2014

Related U.S. Application Data

(63) Continuation of application No. 13/708,988, filed on Dec. 8, 2012.

(51) Int. Cl.
| | |
|---|---|
| *G11C 11/00* | (2006.01) |
| *G11C 13/00* | (2006.01) |
| *G11C 11/21* | (2006.01) |
| *G11C 7/18* | (2006.01) |

(52) U.S. Cl.
CPC ............ *G11C 13/0004* (2013.01); *G11C 11/21* (2013.01); *G11C 7/18* (2013.01)
USPC ............................. 365/158; 365/148; 365/163

(58) Field of Classification Search
USPC .................................................. 365/148, 158
See application file for complete search history.

(56) References Cited

U.S. PATENT DOCUMENTS

| | | | |
|---|---|---|---|
| 5,483,482 A | 1/1996 | Yamada ........................ | 365/175 |
| 6,228,732 B1 * | 5/2001 | Richardson et al. .......... | 438/342 |
| 7,221,591 B1 | 5/2007 | Wong ........................ | 365/185.18 |
| 8,076,714 B2 | 12/2011 | Forbes .......................... | 257/321 |
| 2008/0175032 A1 * | 7/2008 | Tanaka et al. .................... | 365/51 |
| 2010/0081395 A1 * | 4/2010 | Woo et al. ........................ | 455/73 |
| 2012/0099364 A1 * | 4/2012 | Park et al. ..................... | 365/148 |
| 2012/0182802 A1 | 7/2012 | Hung ........................ | 365/185.11 |
| 2012/0306004 A1 | 12/2012 | Yoon ............................. | 257/329 |

\* cited by examiner

*Primary Examiner* — Anthan Tran (74) *Attorney, Agent, or Firm* — Ido Tuchman; Louis J. Percello (57) ABSTRACT

A system, method and computer program product for operating a three-dimensional memory array. An example array includes access transistors with first, second and gate terminals. Bit lines are coupled to the first terminals, word lines coupled to the gate terminals, and vertical lines are coupled to the second terminals. The bit, word, and vertical lines are perpendicular to one another. Memory cells are positioned along the vertical lines, including a bidirectional access device coupled in series with a memory element. The memory element is programmable to first and second states by application of first and second write voltages, opposite in polarity to one another. The array includes conductive plates parallel to the word and bit lines, and perpendicular to the vertical lines. The conductive plates are coupled to memory cells of the same height and separated by insulating layers.

16 Claims, 6 Drawing Sheets

|  | Parallel Bit | Parallel Plate | Block |
|---|---|---|---|
| Word Line | Single | Single | Multiple |
| Bit Line | Multiple | Single | Multiple |
| Conductive Plate | Single | Multiple | Multiple |

FIG. 6

| First Write | Parallel Bit | Parallel Plate | Block |
|---|---|---|---|
| Target Word Line | Target Word Voltage | Target Word Voltage | Target Word Voltage |
| Nontarget Word Line | Off Voltage | Off Voltage | Off Voltage |
| Target Bit Line | Bit Write Voltage | Bit Write Voltage | Bit Write Voltage |
| Nontarget Bit Line | Nontarget Voltage | Nontarget Voltage | Nontarget Voltage |
| Target Conductive Plate | Off Voltage | Off Voltage | Off Voltage |
| Nontarget Conductive Plate | Nontarget Voltage | Nontarget Voltage | Nontarget Voltage |

FIG. 7

| Second Write | Parallel Bit | Parallel Plate | Block |
|---|---|---|---|
| Target Word Line | Target Word Voltage | Target Word Voltage | Target Word Voltage |
| Nontarget Word Line | Off Voltage | Off Voltage | Off Voltage |
| Target Bit Line | Off Voltage | Off Voltage | Off Voltage |
| Nontarget Bit Line | Nontarget Voltage | Nontarget Voltage | Nontarget Voltage |
| Target Conductive Plate | Plate Write Voltage | Plate Write Voltage | Plate Write Voltage |
| Nontarget Conductive Plate | Nontarget Voltage | Nontarget Voltage | Nontarget Voltage |

FIG. 8

| Read | Parallel Bit Read 1 | Parallel Bit Read 2 | Parallel Plate Read 1 | Parallel Plate Read 2 |
|---|---|---|---|---|
| Target Word Line | Target Word Voltage | Target Word Voltage | Target Word Voltage | Target Word Voltage |
| Nontarget Word Line | Off Voltage | Off Voltage | Off Voltage | Off Voltage |
| Target Bit Line | Off Voltage | Source Read Voltage | Off Voltage | Source Read Voltage |
| Nontarget Bit Line | Source Read Voltage | Off Voltage | Source Read Voltage | Off Voltage |
| Target Conductive Plate | Source Read Voltage | Off Voltage | Source Read Voltage | Off Voltage |
| Nontarget Conductive Plate | Off Voltage | Source Read Voltage | Off Voltage | Source Read Voltage |

FIG. 9

| | First Write State | Second Write State | Read State |
|---|---|---|---|
| Target Word Line | Target Word Voltage | Target Word Voltage | Target Word Voltage |
| Nontarget Word Line | Off Voltage | Off Voltage | Off Voltage |
| Target Bit Line | Bit Write Voltage | Off Voltage | Source Read Voltage |
| Nontarget Bit Line | Nontarget Voltage | Nontarget Voltage | Off Voltage |
| Target Conductive Plate | Off Voltage | Plate Write Voltage | Off Voltage |
| Nontarget Conductive Plate | Nontarget Voltage | Nontarget Voltage | Source Read Voltage |

FIG. 10

THREE-DIMENSIONAL MEMORY ARRAY AND OPERATION SCHEME

CROSS-REFERENCE TO RELATED APPLICATIONS

This application claims priority under 35 U.S.C. §120 to U.S. patent application Ser. No. 13/708,988 filed Dec. 8, 2012, the entire text of which is specifically incorporated by reference herein.

BACKGROUND

The present invention relates to memory device technology. More particularly, the present invention relates to systems and operations of three-dimensional memory arrays.

In conventional memory technology, two-dimensional scaling of memory device arrays has presented challenges in reliability and limitations from lithographic technology. Three-dimensional memory arrays have been offered as a possible path to continue scaling devices without the necessity of confronting the same issues.

Current three-dimensional memory arrays generally feature layer-by-layer structure similar to two-dimensional memory arrays. However, current three-dimensional memory array technology requires complex layer-by-layer integration processes. Additionally, with three-dimensions, the programming operations increase in complexity.

BRIEF SUMMARY

An aspect of the present invention is a system for operating a three-dimensional memory array (3D memory array). The 3D memory array includes a plurality of access transistors, each including a first terminal, second terminal and gate terminal. The gate terminal is configured to control an impedance between the first terminal and the second terminal.

The 3D memory array further includes a plurality of bit lines, each electrically coupled to the first terminal of one of the access transistors. The bit lines are configured parallel to a first axis. The 3D memory array includes a plurality of word lines, each electrically coupled to the gate terminal of one of the access transistors. The word lines are configured perpendicular to the bit lines and parallel to a second axis. The 3D memory array further comprises a plurality of vertical lines, each is electrically coupled to the second terminal of one of the access transistors. The vertical lines are configured parallel to a third axis.

The 3D memory array also includes a plurality of memory cells positioned at different heights along the vertical lines. Each of the memory cells includes a bidirectional access device and a memory element. The memory element is electrically coupled in series circuit with the bidirectional access device. The memory element is programmable to a first state by application of a first write voltage or a second state by application of a second write voltage. The second write voltage is opposite in polarity to the first write voltage.

The 3D memory array also includes a plurality of conductive plates separated by a plurality of insulating layers. Each of the conductive plates is electrically coupled to the memory cells of the same height along the vertical lines. The conductive plates are configured parallel to the first axis and second axis, and perpendicular to the third axis.

Another aspect of the invention is a method of operating the 3D memory array. The method includes determining if an operating state of the 3D memory array is a read state, first write state, or second write state. The method includes determining at least one memory cell as a target memory cell, such that target lines are word lines, bit lines, and conductive plates coupled to at least one target memory cell and non-target lines are word lines, bit lines, and conductive plates not coupled to the at least one target memory cell.

The method further includes biasing target memory cells to a first write voltage if the operating state is the first write state, including biasing target lines and non-target lines to a first configuration of source voltages. The method includes biasing target memory cells to a second write voltage if the operating state is the second write state, including biasing target lines and non-target lines to a second configuration of source voltages. The method includes biasing target memory cells to a read voltage if the operating state is the read state, including biasing target lines and non-target lines to a third configuration of the source voltages. The source voltages include a target word voltage, an off voltage, a non-target voltage, a bit write voltage, a plate write voltage, and a source read voltage.

Yet a further example embodiment of the invention is a computer program product for operating a three-dimensional memory array. The computer program product includes computer readable program code configured to: determine if an operating state of the three-dimensional memory array is one of a read state, a first write state, and a second write state, the three-dimensional memory array includes a plurality of memory cells, bit lines, word lines, vertical lines and conductive plates, the memory cells being at cross-points of the vertical lines and conductive plates, wherein the bit lines are coupled to the vertical lines via access transistors with the word lines coupled to gate terminals of the access transistors; select at least one memory cell as a target memory cell, wherein target lines are word lines, bit lines, and conductive plates coupled to at least one target memory cell and non-target lines are word lines, bit lines, and conductive plates not coupled to the at least one target memory cell; bias the target memory cell to a first write voltage if the operating state is the first write state, including biasing target lines and non-target lines to a first configuration of source voltages; bias the at least one target memory cell to a second write voltage if the operating state is the second write state, including biasing target lines and non-target lines to a second configuration of the source voltages, wherein the second write voltage is opposite in polarity to the first write voltage; bias the at least one target memory cell to a read voltage if the operating state is the read state, including biasing target lines and non-target lines to a third configuration of the source voltages. The source voltages include a target word voltage, an off voltage, a non-target voltage, a bit write voltage, a plate write voltage, and a source read voltage.

DETAILED DESCRIPTION

The present invention is described with reference to embodiments of the invention, but shall not be limited to the referenced embodiments. Throughout the description of the present invention, references are made to FIGS. 1 through 10.

Additionally, relative terms, such as "first", "second", "top", and "bottom" are employed with respects to other elements in the described embodiments and figures. Such terms are meant only to describe the referenced embodiments. Likewise, the figures include references to a first axis, a second axis and a third axis from the claimed elements, however, the spirit of the invention is not limited by the orientations of such axis in the provided embodiments. Therefore, the present invention encompasses alternative orientations and configurations of the suggested embodiments.

Embodiments of the present invention provide possible configurations for a three-dimensional memory array (3D memory array), and possible methods for operating such a system. An aspect of the present invention provides a 3D memory array including programmable memory cells arranged such that each memory cell is programmable and readable by biasing word lines, bit lines, and conductive plates to different configurations of source voltages.

Figure 1:
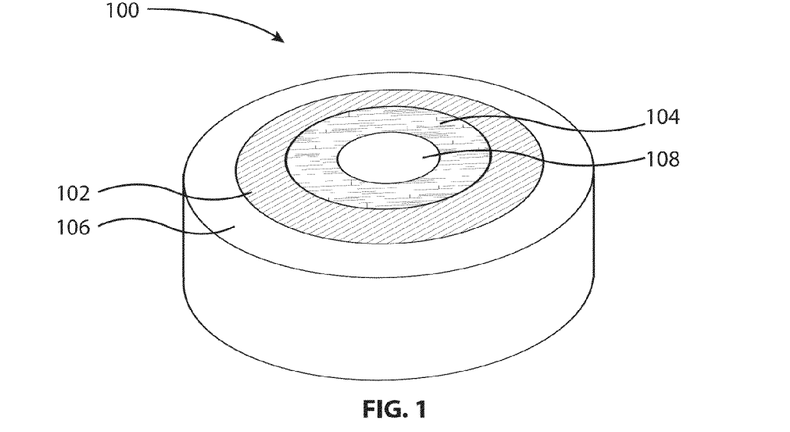
FIG. 1 schematically depicts a memory cell from a 3D memory array, in accordance with one embodiment of the present invention.

FIG. 1 schematically depicts a memory cell 100 from a 3D memory array, in accordance with one embodiment of the present invention. The memory cell 100 includes a bidirectional access device 102 and a memory element 104. The bidirectional access device 102 is electrically coupled to a conductive plate 106. The memory element 104 is electrically coupled to a vertical line 108. Note that only a portion of the conductive plate 106 and vertical line 108 are displayed in FIG. 1. In this embodiment, the memory element 104 laterally surrounds the vertical line 108, the bidirectional access device 102 laterally surrounds the memory element 104, and the conductive plate 106 laterally surrounds the bidirectional access device 102. In some embodiments, the height of the memory cell 100 is less than 100 nanometers. One skilled in the arts would recognize that the height of the memory cell 100 can be utilized to optimize the storage node characteristics.

In some embodiments, the memory element 104 can be comprised of a metal oxide resistance change material, a chalcogenide phase change memory material, or a wide band gap semiconductor material. The bidirectional access device 102 can be comprised of a variety of materials, including tunneling insulator materials and mixed ionic electronic conduction materials.

Figure 2:
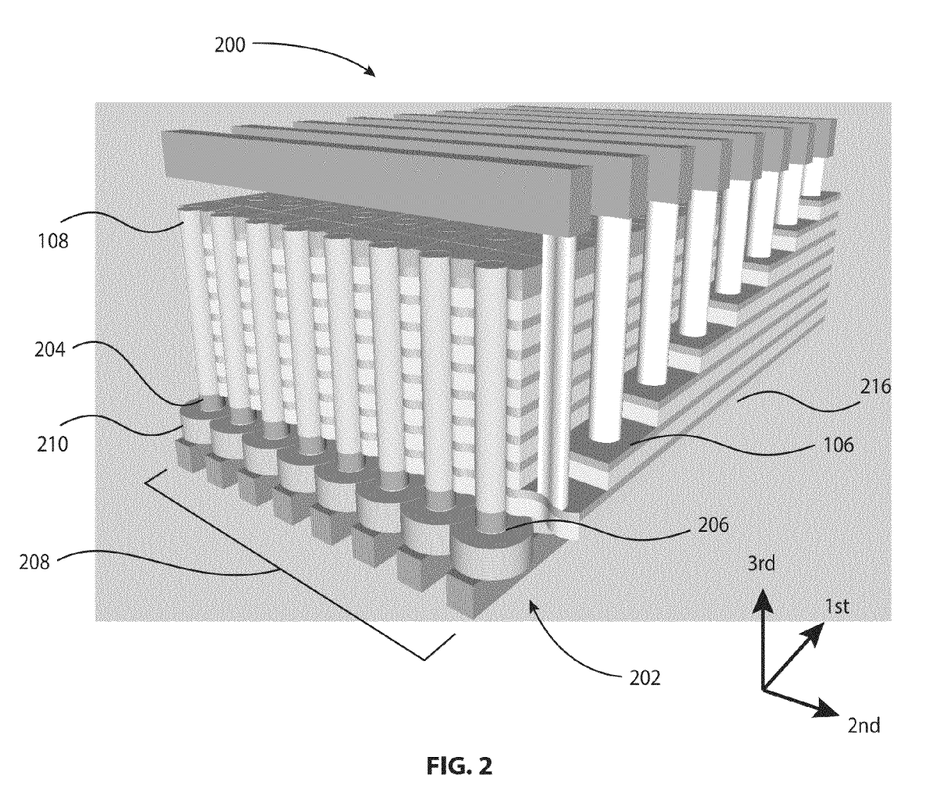
FIG. 2 schematically depicts a three-dimensional view of a 3D memory array, in accordance with one embodiment of the present invention.

FIG. 2 schematically depicts a three-dimensional view of a 3D memory array 200, in accordance with one embodiment of the present invention. The 3D memory array 200 is displayed with a plurality of access transistors 202, each include a first terminal 404 (not displayed, see reference in FIG. 4), a second terminal 204 and a gate terminal 206. The 3D memory array 200 further includes a plurality of bit lines 208, each coupled to a plurality of the access transistors 202 via the first terminals 404. The bit lines 208 are configured parallel to the first axis. The 3D memory array also includes a plurality of word lines 210 (only a single word line visible in the FIG. 2), each coupled to a plurality of the access transistors 202 via the gate terminals 206. The word lines 210 are configured parallel to the second axis.

The 3D memory array 200 further includes a plurality of the vertical lines 108, each coupled to one of the access transistors 202 via the second terminal 204. The vertical lines 108 are configured parallel to the third axis. A plurality of the memory cells 100 are positioned at different heights of the vertical lines 108. The memory cells 100 coupled to the vertical lines 108 via the memory elements 104.

The figure further depicts a plurality of conductive plates 106 configured parallel to the first and second axis, and perpendicular to the third axis. The conductive plates 106 each coupled to a plurality of memory cells 100 via the bidirectional access devices 102. The conductive plates 106 are separated by a plurality of insulating layers 216. The insulating layers 216 configured parallel to the conductive plates 106. In this embodiment, the insulating layers 216 are greater in thickness to the conductive plates 106.

Figure 3:
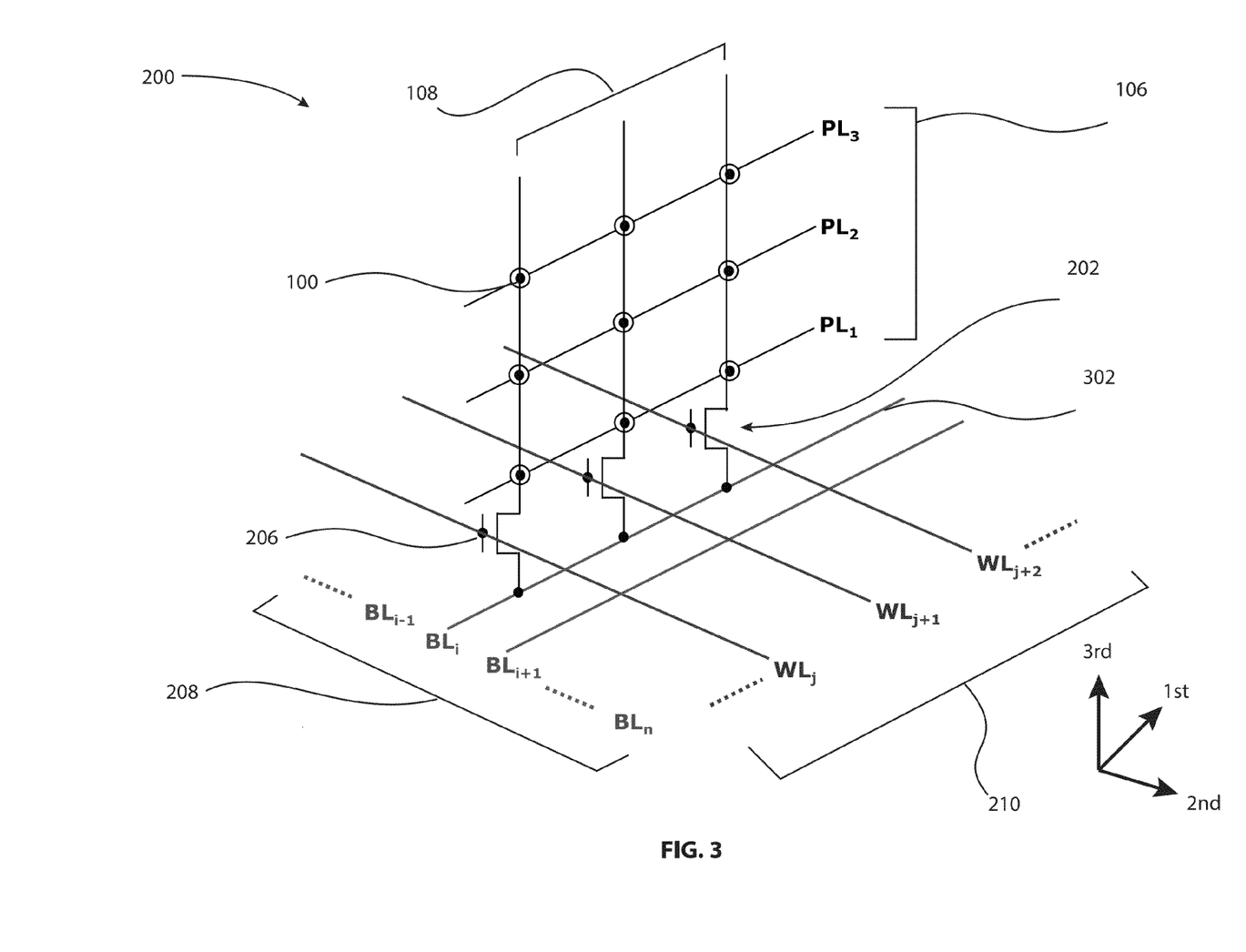
FIG. 3 is a three-dimensional circuit diagram of the 3D memory array, in accordance with one embodiment of the present invention.

FIG. 3 is a three-dimensional circuit diagram of the 3D memory array 200, in accordance with one embodiment of the present invention. FIG. 3 depicts a plurality of conductive plates 106 and vertical lines 108 coupled to a single bit line 302. A plurality of memory cells 100 are depicted as storage nodes at the cross-points of the vertical lines 108 and conductive plates 106. The access transistors 202 exist at the cross-points of the vertical lines 108, bit lines 208, and word lines 210. FIG. 3 only depicts elements coupled to the bit line 302, however, this embodiment includes additional elements not depicted.

Figure 4:
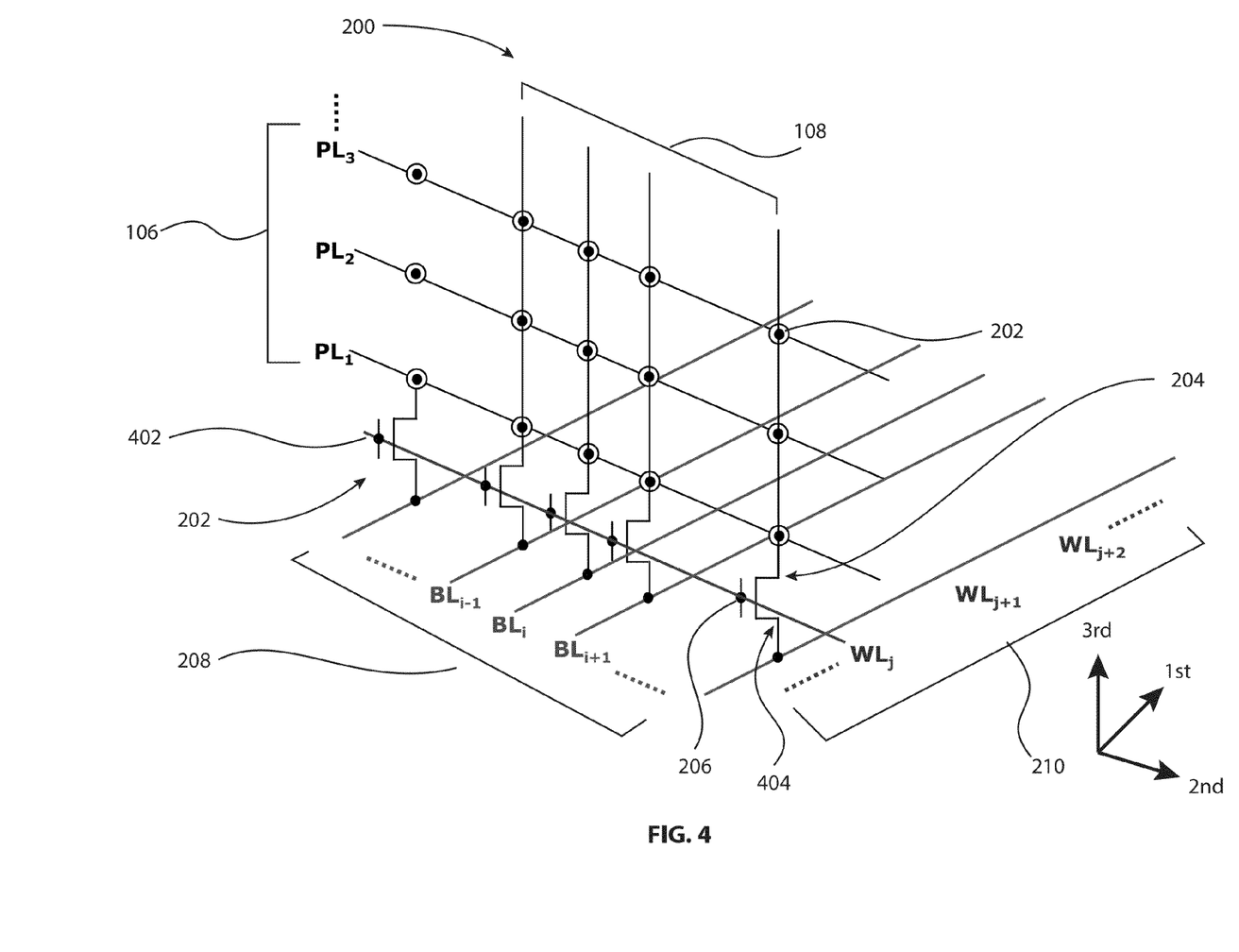
FIG. 4 depicts a three-dimensional circuit diagram of 3D memory array, in accordance with one embodiment of the present invention.

FIG. 4 depicts a three-dimensional circuit diagram of 3D memory array 200, in accordance with one embodiment of the present invention. FIG. 4 depicts a plurality of conductive plates 106 and vertical lines 108 coupled to a single bit line 402. The access transistors 202 exist at the cross-points of the vertical lines 108, bit lines 208, and word lines 210. FIG. 4 depicts the bit lines 208 coupled to the access transistors 202 via the first terminals 404, and the vertical lines 108 coupled to the access transistors 202 via the second terminals 204.

In this embodiment, each vertical line 108 is coupled to one bit line 208 via one access transistor 202 with one word line 210 acting as the gate terminal 206, such that turning on a word line 210 electrically connects the vertical lines 108 with the correlated bit lines 208. FIG. 4 only depicts elements coupled to the word line 402, however, this embodiment includes additional elements not depicted.

Figure 5:
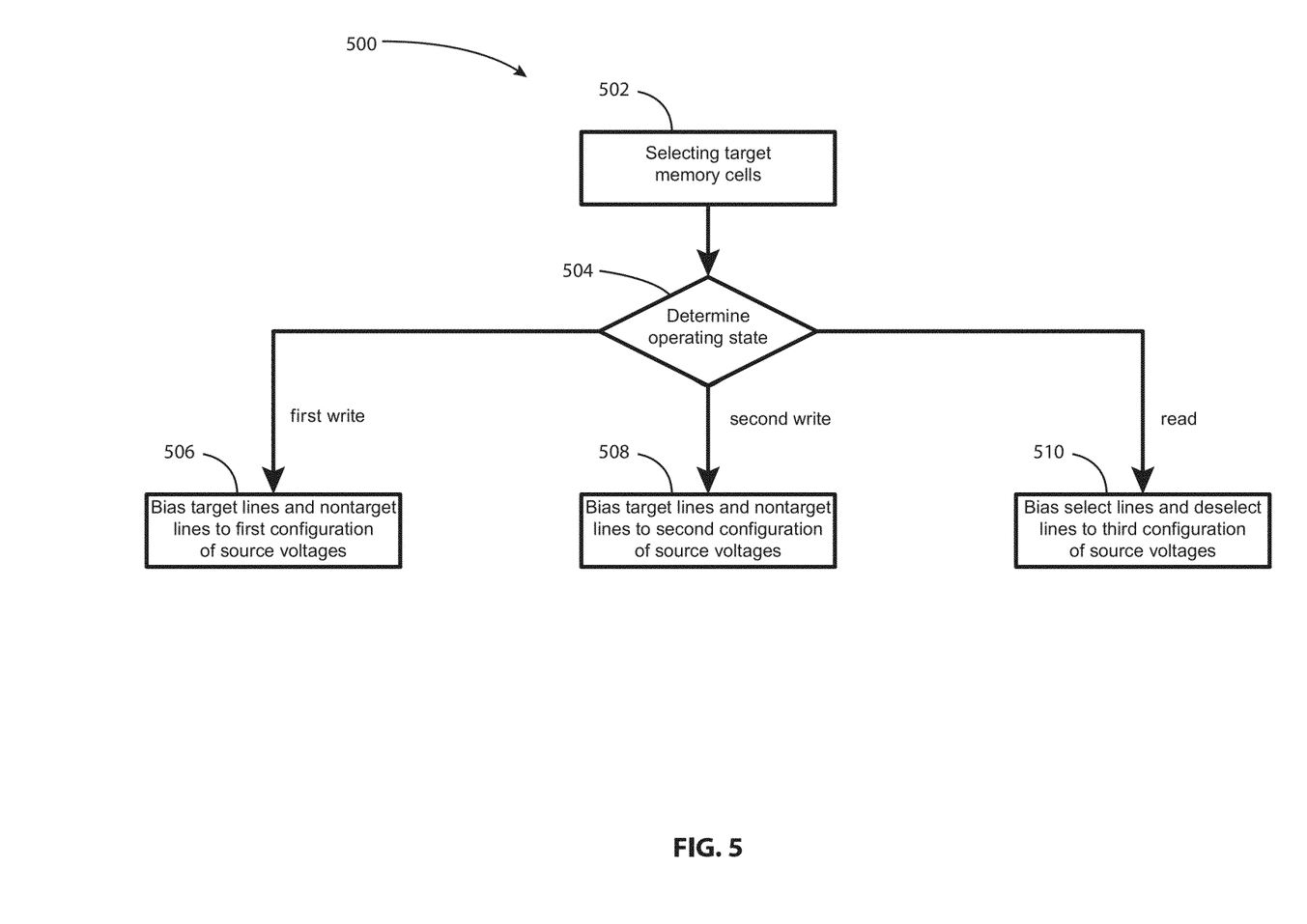
FIG. 5 is a flowchart depicting a method of operating a three-dimensional memory array, in accordance with one embodiment of the present invention.

FIG. 5 is a flowchart depicting a method of operating a three-dimensional memory array, in accordance with one embodiment of the present invention. The method begins with determining step 502. At determining step 502, at least one of the memory cells 100 is determined to be a target memory cell. Such that bit lines 208, word lines 210, and conductive plates 106 electrically coupled to a target memory cell is deemed a target line. Target lines including at least a target bit line, a target word line, and a target conductive plate. Bit lines 208, word lines 210, and conductive plates 106 not coupled to target memory cells are deemed non-target lines. Non-target lines including non-target bit lines, non-target word lines, and non-target conductive plates. After determining step 502, the method proceeds to determining step 504.

At determining step 504, the operating state of the 3D memory array is determined to be one of a first write state, a second write state, and a read state. After determining step 504, the method proceeds to one of biasing step 506, biasing step 508, or biasing step 510, based on the operating state.

If the operating state is one of the first write state, the method proceeds to biasing step 506. At biasing step 506, the target lines and non-target lines are biased to a first configuration of source voltages. The first configuration of source voltages resulting in the target memory cells being biased to a first write voltage. In turn, the target memory cells are programmed to a first memory state. After biasing step 506, the method is complete.

If the operating state is one of the second write state, the method proceeds to biasing step 508. At biasing step 508, the target lines and non-target lines are biased to a second configuration of source voltages. The second configuration of source voltages resulting in the target memory cells being biased to a second write voltage. In turn the target memory cells are programmed to a second memory state. The second write voltage being opposite in polarity to the first write voltage. After biasing step 508, the method is complete.

If the operating state is one of the read state, the method proceeds to biasing step 510. At biasing step 510, the target lines and non-target lines are biased to a third configuration of source voltages. The third configuration of source voltages resulting in the target memory cells being biased to a read voltage. In turn, the memory state of the target memory cells are read. After biasing step 510, the method is complete.

The source voltages include a target word voltage, an off voltage, a non-target voltage, a bit write voltage, a plate write voltage, and a source read voltage. In some embodiments, the source voltages include more than one non-target voltage, a bit non-target voltage for the bit line and a plate non-target voltage for the conductive plates. In some embodiments, the bit write voltage is equal in magnitude to the plate write voltage, but opposite in polarity.

Figure 6:
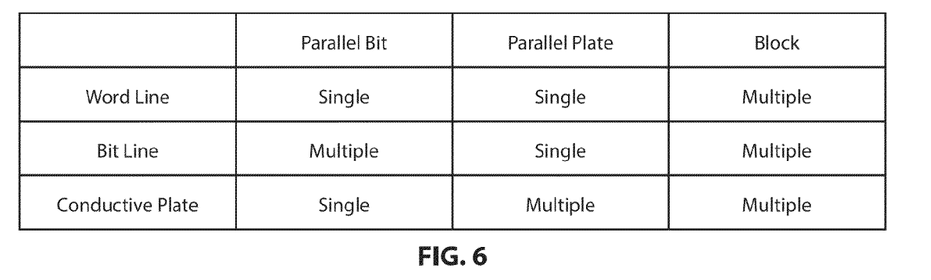
FIG. 6 is a table detailing the plurality of target lines across three different operating schemes for multiple bit selection and programming.

FIG. 6 is a table detailing the plurality of target lines across three different operating schemes for multiple bit selection and programming. In a parallel bit line selection scheme, there can only be a single target word line and single target conductive plate, but multiple target bit lines. As such, multiple bits can be targeted simultaneously on a single plate, along a single word line.

In a parallel conductive plate selection scheme, there can only be a single target word line and single target bit line, but multiple target conductive plates. As such, multiple memory cells can be targeted simultaneously on a single vertical line. In some embodiments, all conductive plates are targeted to minimize leakage current between the conductive plates.

In a block selection scheme, there can be multiple target bit lines, multiple target word lines, and multiple target conductive plates. As such, multiple memory cells can be targeted simultaneously in a block pattern.

Figure 7:
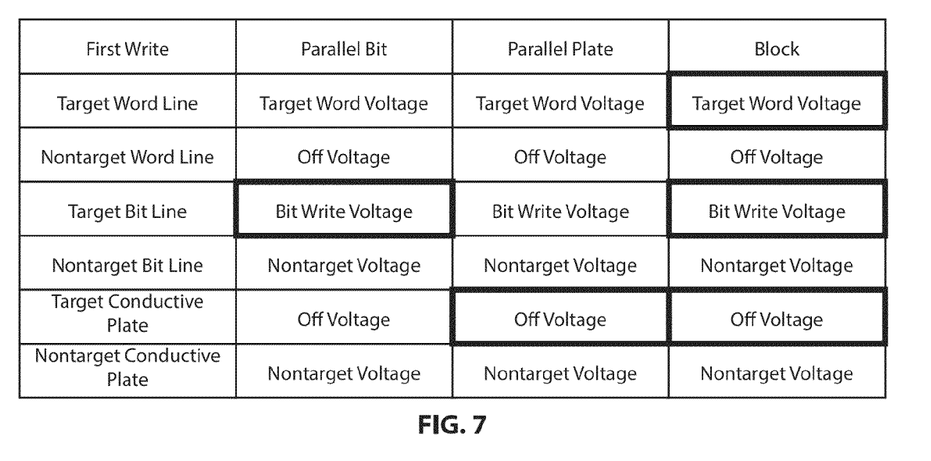
FIG. 7 is a table detailing a first configuration of source voltages across three different operating schemes, in accordance with possible embodiments of the present invention.

FIG. 7 is a table detailing a first configuration of source voltages across three different operating schemes, in accordance with possible embodiments of the present invention. In these embodiments, there can be multiple non-target word lines, non-target bit lines, and non-target conductive plates. However, only the target lines in bold table cells can feature multiple target lines of that type. For example, in the parallel bit line selection scheme, multiple bit lines are targeted and biased to the bit write voltage. However, only a single word line is targeted and biased to the target word voltage. Likewise, only a single conductive plate is targeted and biased to the off voltage.

Figure 8:
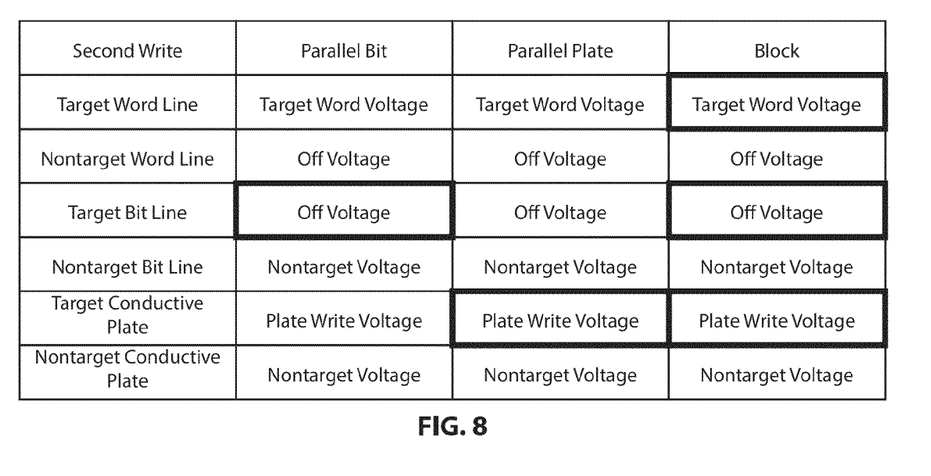
FIG. 8 is a table detailing a second configuration of source voltages across three different operating schemes, in accordance with possible embodiments of the present invention.

FIG. 8 is a table detailing a second configuration of source voltages across three different operating schemes, in accordance with possible embodiments of the present invention. In these embodiments, there can be multiple non-target word lines, non-target bit lines, and non-target conductive plates. However, only the target lines in bold table cells can feature multiple target lines of that type.

Figure 9:
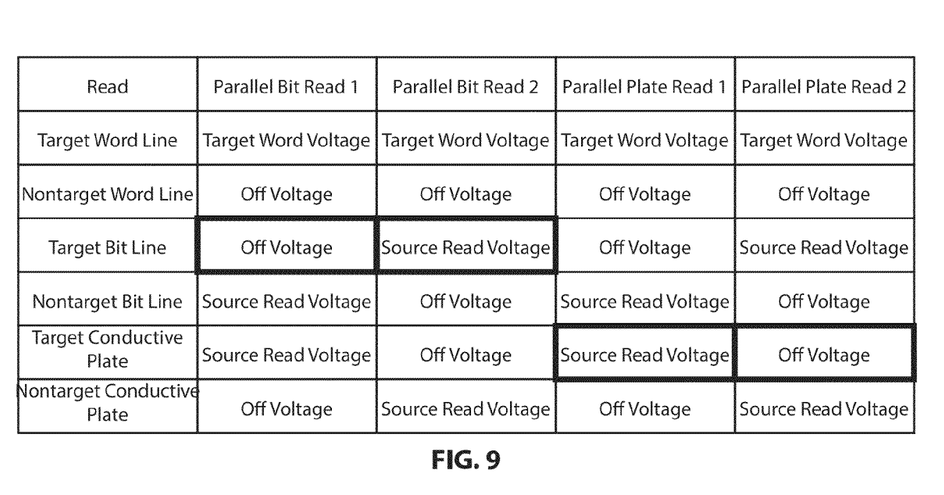
FIG. 9 is a table detailing two different read configurations across two operating schemes, in accordance with possible embodiments of the present invention.

FIG. 9 is a table detailing two different read configurations across two operating schemes, in accordance with possible embodiments of the present invention. The table depicts two different embodiments of the third configuration of source voltages, a read 1 embodiment and a read 2 embodiment.

Figure 10:
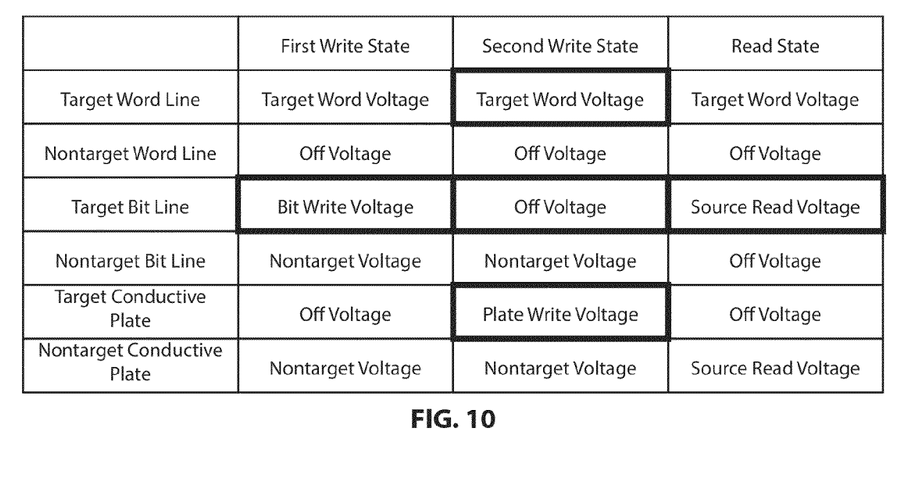
FIG. 10 is a table detailing the first, second and third configurations of source voltages, in accordance with one embodiment of the present invention.

FIG. 10 is a table detailing the first, second and third configurations of source voltages, in accordance with one embodiment of the present invention. In this embodiment, the first write operation and the read operation are both utilizing a parallel bit line selection scheme, but the second write operation is utilizing a block selection scheme. In this embodiment, the off voltage is equal to a ground voltage, the bit write voltage is equal to the first write voltage, and the non-target voltage is greater than the ground voltage but less than the bit write voltage.

For example, biasing the target word line to the target word voltage results in the vertical lines coupled to the target word line to be continuous with the associated bit lines. Theoretically, only considering the mentioned source voltages, all memory cells on the vertical lines at the cross-points of the target word line and target bit lines are biased to the bit write voltage (the first write voltage). However, the non-target conductive plates are biased to the non-target voltage. As such, only the memory cells coupled to the target conductive plate, on the vertical lines at the cross-points of the target word line and target bit lines are biased to the bit write voltage. Memory cells on the same vertical line, but coupled to the non-target conductive are biased to a voltage equal to the difference between the magnitudes of the bit write voltage and the non-target voltage.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for operating a three-dimensional memory array comprising:
    determining if an operating state of the three-dimensional memory array is one of a read state, a first write state, and a second write state, the three-dimensional memory array includes a plurality of memory cells, bit lines, word lines, vertical lines and conductive plates, the memory cells being at cross-points of the vertical lines and conductive plates, wherein the bit lines are coupled to the vertical lines via access transistors with the word lines coupled to gate terminals of the access transistors;
    selecting at least one memory cell as a target memory cell, wherein target lines are word lines, bit lines, and conductive plates coupled to at least one target memory cell and non-target lines are word lines, bit lines, and conductive plates not coupled to the at least one target memory cell;
    biasing the target memory cell to a first write voltage if the operating state is the first write state, including biasing target lines and non-target lines to a first configuration of source voltages;
    biasing the at least one target memory cell to a second write voltage if the operating state is the second write state, including biasing target lines and non-target lines to a second configuration of the source voltages, wherein the second write voltage is opposite in polarity to the first write voltage;
    biasing the at least one target memory cell to a read voltage if the operating state is the read state, including biasing target lines and non-target lines to a third configuration of the source voltages;

wherein the source voltages include a target word voltage, an off voltage, a non-target voltage, a bit write voltage, a plate write voltage, and a source read voltage.

2. The method of claim 1, further comprising:
wherein the off voltage is a ground voltage;
wherein the non-target voltage is greater than the off voltage and less than the bit write voltage;
wherein the bit write voltage is equal in magnitude to the first write voltage;
wherein the plate write voltage is equal in magnitude to the second write voltage; and
wherein the source read voltage is equal in magnitude to the read voltage.

3. The method of claim 1, further comprising:
switching non-target word lines to the off voltage, wherein the non-target word lines are word lines not coupled to the at least one target memory cell;
switching non-target bit lines to the non-target voltage, wherein the non-target bit lines are bit lines not coupled to the at least one target memory cell; and
switching non-target conductive plates to the non-target voltage, wherein the non-target conductive plates are conductive plates not coupled to the at least one target memory cell.

4. The method of claim 3, wherein biasing target lines and non-target lines to the first configuration of source voltages includes:
switching a single target word line to the target word voltage, wherein the single target word line is a word line coupled to the at least one target memory cell;
switching a plurality of target bit lines to the bit write voltage, wherein target bit lines are bit lines coupled to the at least one target memory cell; and
switching a single target conductive plate to the off voltage, wherein the single target conductive plate is a conductive plate coupled to the at least one target memory cell.

5. The method of claim 3, wherein biasing target lines and non-target lines to the second configuration of source voltages includes:
switching a single target word line to the target word voltage, wherein the single target word line is a word line coupled to the at least one target memory cell;
switching a plurality of target bit lines to the off voltage, wherein target bit lines are bit lines coupled to the at least one target memory cell; and
switching a single target conductive plate to the plate write voltage, wherein the single target conductive plate is a conductive plate coupled to the at least one target memory cell.

6. The method of claim 3, wherein biasing target lines and non-target lines to a first configuration of the source voltages includes:
switching a single target word line to the target word voltage, wherein the single target word line is a word line coupled to the at least one target memory cell;
switching a single target bit line to the bit write voltage, wherein the single target bit line is a bit line coupled to the at least one target memory cell;
switching a plurality of target conductive plates to the off voltage, wherein the plurality of target conductive plates are conductive plates coupled to the at least one target memory cell.

7. The method of claim 3, wherein biasing target lines and non-target lines to the second configuration of source voltages includes:
switching a single target word line to the target word voltage, wherein the single target word line is a word line coupled to the at least one target memory cell;
switching a single target bit line to the off voltage, wherein the single target bit line is a bit line coupled to the at least one target memory cell; and
switching a plurality of target conductive plates to the off voltage, wherein the plurality of target conductive plates are conductive plates coupled to the at least one target memory cell.

8. The method of claim 3, wherein biasing target lines and non-target lines to the first configuration of source voltages includes:
switching a plurality of target word lines to the target word voltage, wherein the plurality of target word lines are word lines coupled to the at least one target memory cell;
switching a single target bit line to the bit write voltage, wherein the single target bit line is a bit line coupled to the at least one target memory cell;
switching a plurality of target conductive plates to the off voltage, wherein the plurality of target conductive plates are conductive plates coupled to the at least one target memory cell.

9. The method of claim 3, wherein biasing target lines and non-target lines to the second configuration of source voltages includes:
switching a plurality of target word lines to the target word voltage, wherein the plurality of target word lines are word lines coupled to the at least one target memory cell;
switching a single target bit line to the off voltage, wherein the single target bit line is a bit line coupled to the at least one target memory cell;
switching a plurality of target conductive plates to the plate write voltage, wherein the plurality of target conductive plates are conductive plates coupled to the at least one target memory cell.

10. The method of claim 3, wherein biasing target lines and non-target lines to a third configuration of the source voltages includes:
switching a single target word line to the target word voltage, wherein the single target word line is a word line coupled to the at least one target memory cell;
switching at least one target bit line to the read voltage, wherein the at least one bit line is a bit line coupled to the at least one target memory cell;
switching a single target conductive plate to the plate write voltage, wherein the single target conductive plate is a conductive plate coupled to the at least one target memory cell;
switching a plurality of non-target word lines to the off voltage, wherein the plurality of non-target word lines are word lines not coupled to the at least one target memory cell;
switching a plurality of non-target bit lines to the off voltage, wherein the plurality of non-target bit lines are bit lines not coupled to the at least one target memory cell; and
switching a plurality of non-target conductive plates to the read voltage, wherein the plurality of non-target conductive plates are conductive plates not coupled to the at least one target memory cell.

11. The method of claim 1, further comprising:
wherein the vertical lines are electrically coupled to the memory element of each of the memory cells; and wherein the conductive plates are electrically coupled to a bidirectional access device of each of the memory cells, the bidirectional access device including a tunneling capacitance.

12. The method of claim 11, further comprising:
wherein each memory element laterally surrounds one of the vertical lines;
wherein each bidirectional access device laterally surrounds one of the memory elements; and
wherein each conductive plate laterally surrounds at least one bidirectional access device.

13. The method of claim 1, wherein the memory element includes a phase change memory material.

14. The method of claim 1, wherein the memory element includes a metal oxide resistive memory material.

15. The method of claim 1, wherein the memory element includes a first capacitance at the first state and a second capacitance at the second state, the first capacitance being lower than the second capacitance.

16. The method of claim 11, further comprising a read unit configured to sense a transient read current due to a voltage drop across the memory element and the bidirectional access device upon application of a read voltage across one of the conductive plates and the vertical line.

\* \* \* \* \*